United States Patent [19]

Hall

[11] 4,318,118

[45] Mar. 2, 1982

[54] SEMICONDUCTOR STRUCTURE AND METHOD

[75] Inventor: John H. Hall, Saratoga, Calif.

[73] Assignee: Micro Power Systems, Inc., Santa Clara, Calif.

[21] Appl. No.: 128,860

[22] Filed: Mar. 10, 1980

Related U.S. Application Data

[63] Continuation of Ser. No. 945,512, Sep. 25, 1978, abandoned.

[51] Int. Cl.$^3$ ............................................. H01L 29/34
[52] U.S. Cl. ......................................... 357/54; 357/23
[58] Field of Search .............................. 357/23, 41, 54

*Primary Examiner*—Martin H. Edlow
*Attorney, Agent, or Firm*—Flehr, Hohbach, Test, Albritton & Herbert

[57] ABSTRACT

A semiconductor structure including a body of semiconductor material with selected surface areas of at least one surface of said body of semiconductor material including an oxide layer containing impurities characterizing a predetermined conductivity type, an inset region of said predetermined conductivity type under each of said areas formed by diffusion of impurities from said oxide layer and a silicon nitride layer covering said predetermined oxide areas and the remaining surface areas of said at least one surface of said body of semiconductor material.

The method of forming inset regions of predetermined conductivity type in a body of semiconductor material which includes the steps of forming on predetermined areas of a surface of said body a doped oxide layer, forming a silicon nitride layer on said surface to cover said areas and the remainder of the surface of said body and heating said body to cause the impurities in said oxide layer to diffuse inwardly into the body to form inset regions under said areas while said silicon nitride layer prevents out-gasing of impurities from the oxide areas.

2 Claims, 10 Drawing Figures

FIG_1A
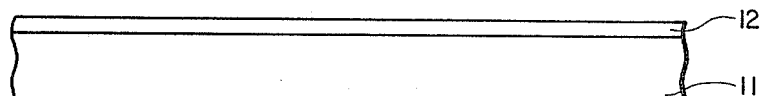
FIG_1B
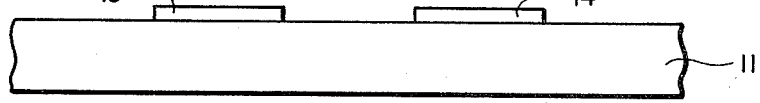
FIG_1C
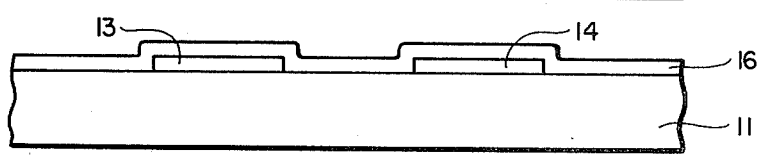
FIG_1D
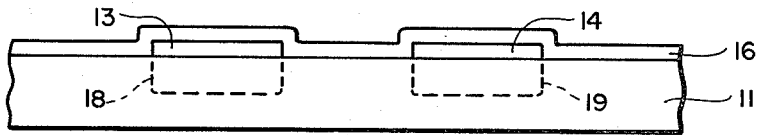
FIG_1E
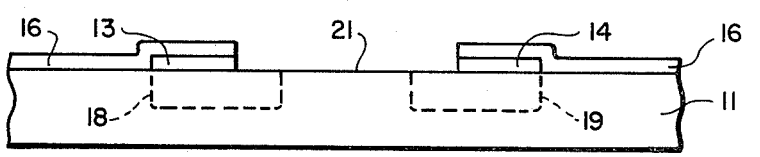
FIG_1F
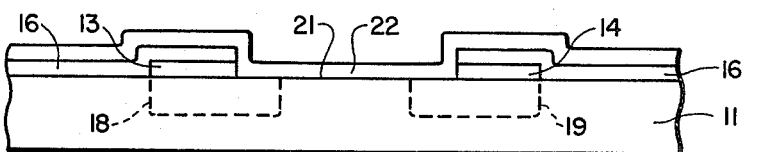
FIG_1G
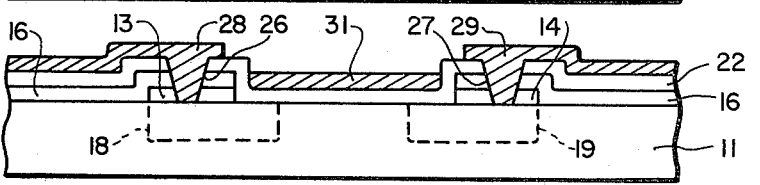
FIG_1H
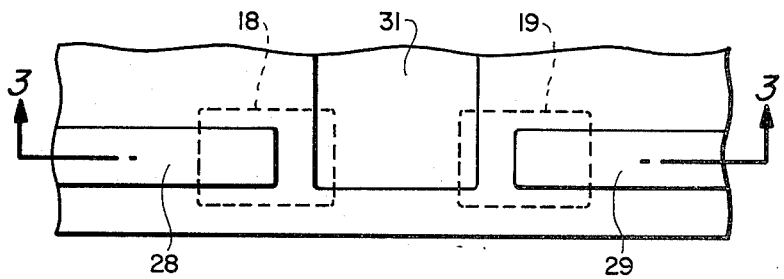
FIG_2
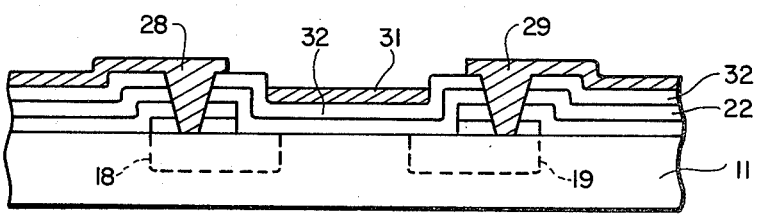
FIG_3

SEMICONDUCTOR STRUCTURE AND METHOD

This is a continuation of application Ser. No. 945,512 filed Sept. 25, 1978, now abandoned.

BACKGROUND OF THE INVENTION

This invention relates generally to a semiconductor structure and to method of making the same and more particularly to a structure including inset regions.

Various methods have been employed for forming junctions in semiconductor substrates. Perhaps the most common method has been to form on predetermined areas of a surface of the body a layer containing impurities and then heating the body to cause the impurities to diffuse inwardly into the body under said area. Another method has been to form alloy junctions. A further method has been to prediffuse impurities on surface areas of the body, etching said surface to remove loose impurities and any glass which may be formed leaving the diffusion of impurities and subsequently subjecting the wafer to a high temperature whereby the impurities are diffused further into the body to form inset regions.

In U.S. Pat. No. 3,281,291 there is described a process in which impurities are deposited on the selected surfaces of the wafer by forming a silicon oxide layer containing the impurities and then heating the wafer to diffuse the impurities from the oxide layer into the wafer. In this method the total surface of the semiconductor body is covered with the silicon oxide layer containing the impurities. There is no provision for preventing out-gasing of the impurities. There is no suggestion of forming regions of predetermined area.

OBJECTS AND SUMMARY OF THE INVENTION

It is a general object of the present invention to provide an improved semiconductor structure.

It is another object of the present invention to provide an improved method for forming inset regions in semiconductor bodies.

It is a further object of the present invention to provide a semiconductor structure and method having inset regions in which the effect of surface impurities, surface leakage and channeling is minimized.

The foregoing and other objects of the invention are achieved by forming a semiconductor structure with a silicon body having on its surface a plurality of areas of low temperature oxide containing impurities and a plurality of regions containing impurities diffused from said areas underlying said areas and a silicon nitride layer overlying said areas.

The invention also relates to a method of forming a structure of the above character which comprises the steps of forming low temperature oxide layer containing the impurities to be diffused into the underlying body on a surface of the body selectively removing portions of said layer to leave selected areas on the body, covering said areas with a silicon nitride layer and thereafter heating the body to diffuse impurities into the body from said selected areas.

BRIEF DESCRIPTION OF THE DRAWINGS

FIGS. 1A through 1H show the steps in forming a semiconductor device in accordance with the invention.

FIG. 2 is a top elevational view of an MOS device formed in accordance with the steps of FIG. 1.

FIG. 3 is a cross sectional view of another device in accordance with the present invention.

DESCRIPTION OF PREFERRED EMBODIMENTS

The description to follow is with reference to a metal-oxide-silicon (MOS) device formed in accordance with the method of the present invention. It will become apparent from the description that the same process and structure can be employed for a P-channel and N-channel devices, for bipolar devices, complimentary MOS devices and other semiconductor devices having inset regions.

Referring particularly to FIGS. 1A–1H, the steps in forming a P-channel MOS device are set forth. A semiconductor wafer, slice or body 11 containing donor impurities such as phosphorus or the like to provide a resistivity of 3–5-ohm-centimeters, FIG. 1A, is processed to form a low temperature silicon oxide surface layer 12, FIG. 1B. The silicon oxide layer contains acceptor impurities such as boron with a concentration in the range of $10^{16}$ to $10^{18}$ atoms/cm$^3$, FIG. 1B. Thereafter the surface is masked and etched to provide a pair of spaced oxide layer areas 13 and 14, FIG. 1C. The wafer 11 with areas 13 and 14 is then placed in a furnace and a silicon nitride, Si$_3$N$_4$ layer is formed by the thermal decomposition of ammonia and silane gases at a temperature of between 600–1000 degrees centigrade. This forms a silicon nitride layer 16 which extends over and covers the regions 13 and 14 and the exposed portions of the body 11, FIG. 1D. Thereafter the wafer is placed in a furnace and subjected to elevated temperatures in the range of 1000 to 1200 degrees centigrade. The impurities in the silicon oxide layer areas 13 and 14 diffuse inwardly to form inset regions 18 and 19, FIG. 1E. For example, diffusion may be carried out until the inset regions have a depth of between one and two microns. The silicon nitride layer serves to seal the areas 13 and 14 and inhibits out-gasing of impurities into the furnace atmosphere and forces the impurities to diffuse inwardly.

The wafer is then masked and etched to expose the upper surface portion 21 of the wafer between the two inset regions 18 and 19 and a portion of the upper surface of the inset regions, FIG. 1F. The wafer is placed in a furnace and subjected to a relatively high temperature in an oxidizing atmosphere to thereby form a silicon oxide layer 22 which covers the remaining silicon nitride layer portions 16 and the exposed surface portion 21 of the wafer, FIG. 1G. The silicon oxide layer is grown to a thickness of between 0.5 and 1.5 microns. The structure is then suitably masked and etched to form openings 26 and 27 which expose the upper surface of the inset regions 18 and 19 respectively in the region underlying the silicon dope oxide areas 13 and 14. An aluminum layer is evaporated on the surface and suitably masked and etched to delineate source contact 28, drain contact 29, and the gate electrode 31, FIGS. 1H and 2.

The process just described can be used to form a silicon nitride MOS device by adding an additional step in which a silicon nitride layer 32 is formed over the surface of the silicon oxide layer 22 prior to forming the contact openings and the contacts. A device including a silicon nitride protective layer is shown in FIG. 3 with like reference numerals indicating the regions previously described.

Thus it is seen that there is provided an improved method of forming inset regions in a semiconductor wafer. More particularly a process in which the exposed junctions are protected by a silicon nitride layer and in which the regions 13 and 14 provide better contact to the inset regions forming the source and drain.

What is claimed is:

1. A semiconductor transistor structure comprising a body of semiconductor material containing impurities of one conductivity type having a surface, two spaced layers of low resistivity silicon oxide containing conductivity determining impurities of opposite conductivity type on said surface, two regions containing impurities of said opposite conductivity type inset into said body and extending to said surface and diffused inwardly from said silicon oxide layers, said two regions comprising source and drain regions of said transistor structure and said two spaced layers of low resistivity silicon oxide comprising low ohmic contacts to said source and drain regions, and an insulative layer covering said silicon oxide layers.

2. A semiconductor transistor structure as in claim 1 in which said low resistivity silicon oxide layers and said insulative layer include openings exposing said inset regions, and metal layers making ohmic contact to said low resistivity silicon oxide and to said regions through said opening.

* * * * *